(12) United States Patent
Wall et al.

(10) Patent No.: US 6,526,768 B2
(45) Date of Patent: Mar. 4, 2003

(54) APPARATUS AND METHOD FOR CONTROLLING THE TEMPERATURE OF AN INTEGRATED CIRCUIT DEVICE

(75) Inventors: Charles B. Wall, Lexington, SC (US); Terry Craps, Lexington, SC (US); Charles R. Schmidt, Lexington, SC (US); Matthew F. W. Brown, Columbia, SC (US)

(73) Assignee: Kryotech, Inc., West Columbia, SC (US)

( * ) Notice: Subject to any disclaimer, the term of this patent is extended or adjusted under 35 U.S.C. 154(b) by 0 days.

(21) Appl. No.: 09/911,870

(22) Filed: Jul. 24, 2001

(65) Prior Publication Data

US 2003/0019235 A1 Jan. 30, 2003

(51) Int. Cl.[7] ............................ F25B 39/04; F25D 23/12
(52) U.S. Cl. ........................................ 62/184; 62/259.2
(58) Field of Search ................. 62/184, 183, 259.2, 62/177, 178, 180, 181, 511; 361/688

(56) References Cited

U.S. PATENT DOCUMENTS

| | | | | |
|---|---|---|---|---|
| 3,293,876 A | * | 12/1966 | Geisler ........................ | 62/184 |
| 3,735,602 A | * | 5/1973 | Ramsey ....................... | 62/184 |
| 3,811,292 A | * | 5/1974 | Hoenisch ..................... | 62/183 |
| 3,815,378 A | * | 6/1974 | Hoenisch ..................... | 62/184 |
| 5,138,844 A | * | 8/1992 | Clanin et al. ................. | 62/89 |
| 5,150,581 A | * | 9/1992 | Smith .......................... | 62/115 |
| 5,385,030 A | * | 1/1995 | Kitagawa et al. ............. | 62/160 |
| 5,622,055 A | * | 4/1997 | Mei et al. ..................... | 62/113 |
| 6,122,926 A | * | 9/2000 | Kang et al. .................. | 62/259.2 |
| 6,243,268 B1 | | 6/2001 | Kang et al. .................. | 361/715 |
| 6,257,007 B1 | * | 7/2001 | Hartman ...................... | 62/183 |
| 2001/0054293 A1 | * | 12/2001 | Gustafson et al. ........... | 62/183 |

OTHER PUBLICATIONS

International Search Report for corresponding PCT application, dated Aug. 21, 2002, 4 pages.

* cited by examiner

*Primary Examiner*—Denise L. Esquivel
*Assistant Examiner*—Marc Norman
(74) *Attorney, Agent, or Firm*—Nelson Mullins Riley & Scarborough

(57) ABSTRACT

An apparatus and method for controlling the temperature of an integrated circuit device includes a refrigerant system having a coolant loop containing refrigerant, an evaporator, a compressor, and a condenser. The condenser has a variable speed fan controlled to maintain the temperature of the refrigerant at a predetermined value. In a refrigeration system used to cool an integrated circuit device, a method for controlling refrigerant pressure by comparing the refrigerant temperature at a predetermined location to a predetermined value and varying the cooling applied to the condenser.

14 Claims, 3 Drawing Sheets

APPARATUS AND METHOD FOR CONTROLLING THE TEMPERATURE OF AN INTEGRATED CIRCUIT DEVICE

BACKGROUND OF THE INVENTION

The present invention relates generally to integrated circuit devices such as the microprocessors of computers and more particularly to the cooling of such devices to below ambient temperatures for improved efficiency and enhanced speed of operation.

It is well known in the electronics industry that cooling integrated circuit devices to below ambient temperatures substantially improves the efficiency and speed at which such devices can operate. Such cooling is particularly beneficial in microprocessors that form the heart of modern day computers. For example, it has been found that the performance of a desktop computer can be significantly improved by cooling the microprocessor to temperatures of −40 degrees Centigrade or below.

Various methods and apparatus are known in the art for removing the thermal heat generated by integrated circuit devices. For example, KryoTech, Inc., the assignee of the present invention, has previously developed a refrigeration system for cooling an integrated circuit device in a desktop computer. This refrigeration system operates by circulating refrigerant fluid to a thermal head engaging the microprocessor.

The thermal head defined a flow channel through which the refrigerant fluid would pass as it circulated around the closed loop of the refrigeration system. Due to its design, the thermal head functioned as an evaporator where the refrigerant fluid was converted from liquid to gaseous form. In accordance with known thermodynamic principles, thermal energy was thus removed from the location of the microprocessor. The gaseous refrigerant drawn from the evaporator by a compressor was then fed back to a condenser where the thermal energy was removed.

As one skilled in the art will appreciate, size limitations require the refrigeration system to be relatively small with a relatively low volume of refrigerant. As a result, slight changes in ambient air temperature directly affect the system's performance. For example, a decrease in ambient temperature causes the continuous operation fan to remove more heat from the gaseous refrigerant in the condenser. This results in liquid refrigerant exiting the condenser at a lower temperature and pressure. Given the small volume of refrigerant available, even a slight decrease in ambient temperature can reduce liquid refrigerant pressure excessively and significantly reduce the cooling capacity of the refrigeration system.

SUMMARY OF THE INVENTION

In one aspect, the present invention provides an integrated circuit device cooled by a refrigeration system. In this embodiment, the refrigeration system comprises a coolant loop containing a refrigerant, an evaporator, a compressor, and a condenser.

The evaporator is in thermal contact with the integrated circuit device and defines a flow channel for passage of the refrigerant to remove thermal energy from the integrated circuit device. The compressor increases the pressure of the refrigerant exiting the evaporator. The condenser is located between the compressor and the evaporator and includes a variable speed fan to force air across the condenser. A temperature sensor in thermal contact with the refrigerant provides a signal to a controller for varying the speed of the fan to maintain the refrigerant at a predetermined temperature.

Other aspects of the present invention provide a refrigerant system for cooling an integrated circuit device. The refrigerant system comprises a coolant loop containing refrigerant, an evaporator, a compressor, and a condenser.

The evaporator is in thermal contact with the integrated circuit device and has an inlet plenum and an exhaust plenum. The evaporator further defines a flow channel between the inlet plenum and exhaust plenum, and the refrigerant passes through the flow channel to absorb thermal energy from the integrated circuit device, changing the refrigerant to a gaseous state. The compressor has a suction and a discharge, and the coolant loop connects the evaporator exhaust plenum to the compressor suction. The gaseous refrigerant passes through the compressor and is discharged at a higher pressure. The condenser connects between the compressor discharge and the evaporator inlet plenum. The condenser includes a variable speed fan to remove thermal energy from the gaseous refrigerant passing through the condenser, changing the gaseous refrigerant to a liquid state. A temperature sensor in thermal contact with the refrigerant provides a signal to a controller for varying the speed of the fan to maintain the refrigerant at a predetermined temperature.

In some exemplary embodiments, the temperature sensor measures the temperature of the refrigerant between the condenser and the evaporator. In other exemplary embodiments, the coolant loop includes a capillary tube between the condenser and the evaporator for restricting flow of the refrigerant from the condenser to the evaporator. It will often be desirable that the capillary tube produces a refrigerant pressure entering the capillary tube of more than 225 pounds per square inch.

Still further aspects of the present invention are provided by a method used to cool an integrated circuit device. The method uses a refrigeration system to circulate a refrigerant throughout a coolant loop including a compressor, a condenser, and an evaporator. The method controls refrigerant pressure by providing a variable speed fan operational across the condenser for removing thermal energy from the refrigerant. The method detects a temperature of the refrigerant at a predetermined location and compares the temperature to a predetermined value. If the temperature exceeds the predetermined value, indicating that the refrigerant pressure is too high, the method increases the variable speed of the fan to reduce the temperature.

If the predetermined value exceeds the temperature, indicating that the refrigerant pressure is too low, the method decreases the variable speed of the fan to increase the temperature. In an exemplary embodiment, the predetermined location is between the condenser and the evaporator.

Other objects, features and aspects of the present invention are discussed in greater detail below.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying drawings, in which.

Figure 1:
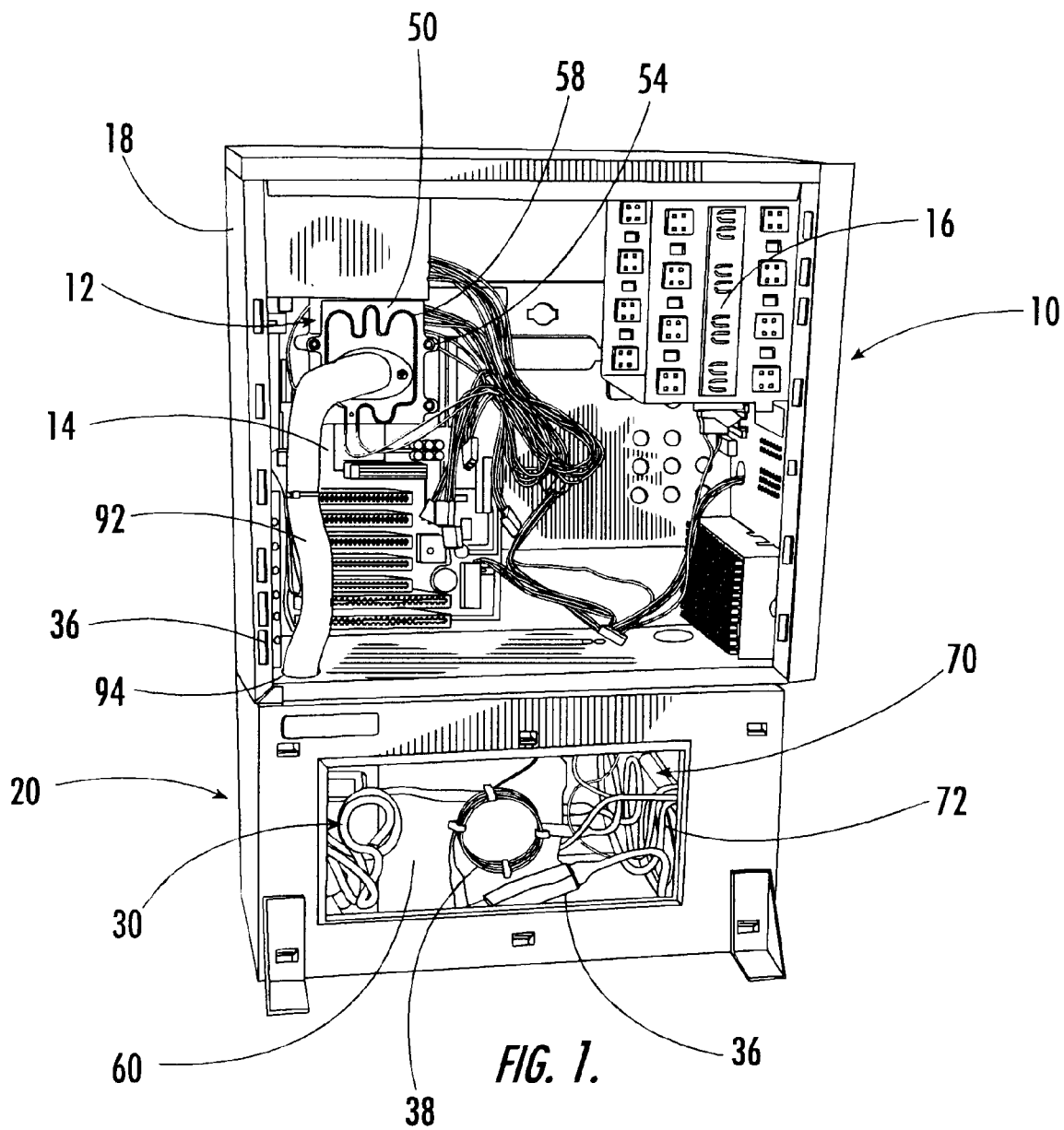
FIG. 1 is a perspective view of a computer having a refrigeration system constructed in accordance with the present invention.

Repeat use of reference characters in the present specification and drawings is intended to represent same or analogous features or elements of the invention.

DETAILED DESCRIPTION OF PREFERRED EMBODIMENTS

Reference will now be made in detail to presently preferred embodiments of the invention, one or more examples of which are illustrated in the accompanying drawings. Each example is provided by way of explanation of the invention, not limitation of the invention. In fact, it will be apparent to those skilled in the art that modifications and variations can be made in the present invention without departing from the scope or spirit thereof. For instance, features illustrated or described as part of one embodiment may be used on another embodiment to yield a still further embodiment. Thus, it is intended that the present invention covers such modifications and variations as come within the scope of the appended claims and their equivalents.

Figure 2:
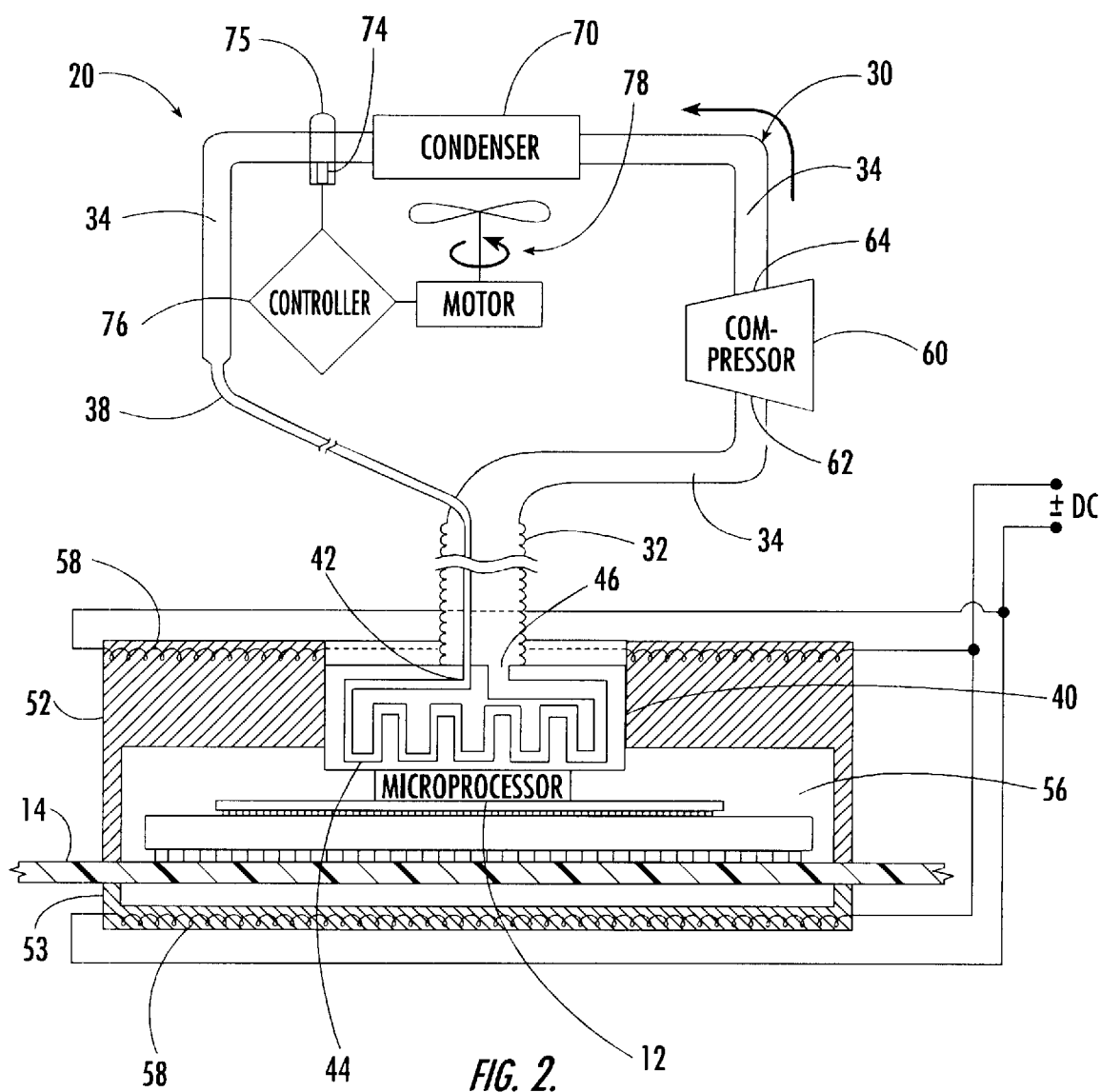
FIG. 2 is a diagrammatic representation of the refrigeration system that is installed in the computer of FIG. 1.

FIG. 1 illustrates a computer 10 including a refrigeration system 20 constructed in accordance with the present invention. The refrigeration system 20 operates to cool an integrated circuit device, such as the computer's microprocessor 12 (FIG. 2). It should be understood, however, that the present invention is not limited to cooling a microprocessor 12 but is equally applicable to cooling any integrated circuit device that can benefit from lower operating temperatures.

As shown, the computer 10 generally includes a mother board 14, various other devices, a power supply 16, and a housing 18. The mother board 14 provides a centralized platform for locating various electronic components, including the microprocessor 12.

Referring to FIGS. 1 and 2, the general components of the refrigeration system 20 include a coolant loop 30, an evaporator 40, a compressor 60, and a condenser 70.

The coolant loop 30 comprises flexible tubing 32 made from copper, stainless steel, or a synthetic material to connect the various components of the refrigeration system 20 in series. The flexible tubing 32 contains a refrigerant 34, such as R404a, R507a, R134a, or other suitable substitute, for circulation throughout the refrigeration system 20. During circulation, the refrigerant 34 changes between gaseous and liquid states to alternately absorb and release thermal energy. Insulation material 36 surrounds the flexible tubing over portions of the coolant loop 30 that contain refrigerant 34 below the local ambient dew point to prevent condensation from forming.

The length and inner diameter of the coolant loop 30 depends on the location in the refrigeration system 20. For example, between the condenser 70 and the evaporator 40, the coolant loop 30 necks down to form a capillary tube 38. In presently preferred embodiments, the capillary tube 38 may be approximately ten feet long and have an inner diameter of approximately 0.026 inches. In this configuration, the capillary tube 38 ensures refrigerant pressure at its inlet will be greater than 110 pounds per square inch, preferably between 225 and 250 pounds per square inch. It should be understood by one of ordinary skill in the art that integrated circuit devices having different thermal demands may require variations in the length and inner diameter of the flexible tubing 32, and these variations are within the scope of the present invention.

The evaporator 40 mounts directly on the integrated circuit device, in this illustration a microprocessor 12 of a computer 10. The evaporator 40 is formed from a highly thermally conductive material, such as brass or copper, to maximize heat transfer from the microprocessor 12. The evaporator 40 includes an inlet plenum 42 for receiving the refrigerant 34. The inlet plenum 42 opens to a flow channel 44 which traverses the interior of the evaporator 40 and provides maximum surface area for the refrigerant 34. The flow channel 44 terminates at an exhaust plenum 46 for exhausting the refrigerant 34 from the evaporator 40.

A mounting assembly 50 fixedly attaches the evaporator 40 to the microprocessor 12. In general, the mounting assembly 50 includes an upper section 52 and a lower section 53 which attach by way of fasteners 54, such as bolts that extend through mating flanges. Other methods of fastening are known in the art and within the scope of the present invention. In this manner, the mounting assembly 50 defines an airtight chamber 56 around the evaporator 40 and the microprocessor 12 to isolate the cooled components from ambient air. Heating elements 58 imbedded in the upper 52 and lower 53 sections maintain the exterior surface of the mounting assembly 50 above the local ambient dew point, thus preventing g condensation from forming.

The preceding description of the evaporator 40 and mounting assembly 50 is by way of example only and is not intended to limit the scope of the present invention. A more detailed description of a preferred construction of an evaporator and mounting assembly is described in pending patent application Ser. No. 09/911,865, filed by Lewis S. Wayburn, Derek E. Gage, Andrew M. Hayes, R. Walton Barker and David W. Niles on Jul. 24, 2001, titled "Integrated Circuit Cooling Apparatus", assigned to Kryotech, Inc., the assignee of the present invention, and incorporated here by reference.

The compressor 60 includes a suction 62 and a discharge 64 and connects downstream of the evaporator exhaust plenum 46. As is understood by one of ordinary skill in the art, the compressor 60 functions to increase the pressure of the gaseous refrigerant 34. The compressor 60 operates at a constant rate from a constant voltage power supply (not shown), although a variable rate compressor may also be used in some embodiments.

The condenser 70 connects in series between the compressor 60 and the evaporator 40. The condenser 70 includes cooling coils 72, a temperature sensor 74, a controller 76, and a variable speed fan 78. The cooling coils 72 are formed from a highly thermally conductive material, such as brass, aluminum, stainless steel, or copper, to maximize heat transfer from the condenser 70 to the environment. The temperature sensor 74 may be a thermocouple or other suitable substitute for measuring refrigerant temperature at a predetermined location. In one embodiment, the temperature sensor 74 is in thermal contact with the coolant loop 30 between the condenser 70 and the evaporator 40. Insulation 75 around the temperature sensor 74 enables the temperature sensor 74 to accurately measure the refrigerant temperature inside the coolant loop 30 without penetrating the coolant loop 30. The temperature sensor 74 provides an electrical signal 82 (shown in FIG. 3) to the controller 76 responsive to the temperature of the refrigerant leaving the condenser 70.

In one embodiment, the controller includes a pulse width modulator circuit 80 (FIG. 3) to proportionally control the operating speed of fan 78 based on the electrical signal 82 from the temperature sensor 74. The variable speed fan 78 forces ambient air across the cooling coils 72 to transfer thermal energy from the condenser 70 to the environment.

The refrigeration system 20 can be an after market component capable of installation with minimal modification to the integrated circuit device. For example, referring again to FIG. 1, the refrigeration system 20 can mount adjacent to the computer housing 18. The coolant loop 30 can supply and return the refrigerant 34 to the microprocessor 12 through a thermal bus 92 extending through a cutout 94 in the computer housing 18. The mounting assembly 50 then attaches over the microprocessor 12 to secure the evaporator 40 in position to cool the microprocessor 12.

Figure 3:
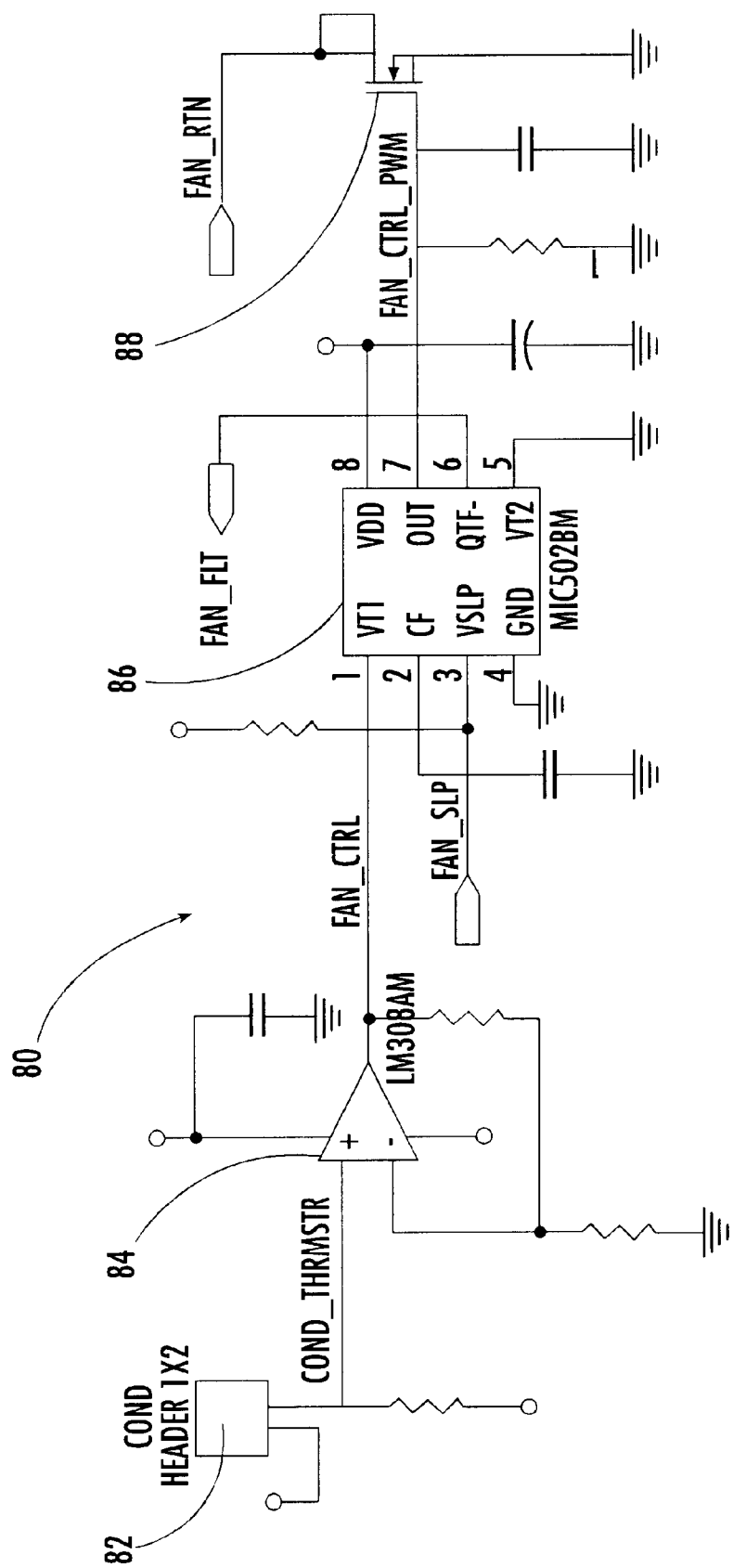
FIG. 3 is a schematic diagram of preferred controller circuitry for use in the refrigeration system of FIG. 2.

Referring now to FIGS. 2 and 3, the operation of the refrigeration system 20 will be described in more detail. Starting at the evaporator 40, the liquid refrigerant 34 enters the evaporator 40 through the inlet plenum 42 where it expands into the flow channel 44. The expansion of the liquid refrigerant 34 reduces the pressure of the refrigerant, causing the liquid refrigerant 34 to change to a gaseous state. The gaseous refrigerant 34 traverses through the flow channel 44 to quickly cool the evaporator 40, to approximately −40 degrees Centigrade in one embodiment. The thermally conductive surface of the evaporator 40 transfers thermal energy from the microprocessor 12 to the gaseous refrigerant 34. Simultaneously, the heating elements 58 embedded on the exterior surface of the mounting assembly 50 ensure that the exterior of the mounting assembly 50 remains above the local dew point to prevent condensation from forming.

The gaseous refrigerant 34 exits the flow channel 44 at the exhaust plenum 46 and passes through the coolant loop 30 to the compressor 60. The compressor 60 increases the pressure of the gaseous refrigerant 34, and the gaseous refrigerant 34 exits the compressor discharge 64 at a much higher temperature and pressure.

The pressurized and heated gaseous refrigerant 34 passes through the coolant loop 30 to the cooling coils 72 (shown in FIG. 1) in the condenser 70. As the heated gaseous refrigerant 34 passes through the cooling coils 72, the variable speed fan 78 forces ambient air across the cooling coils 72, and the ambient air removes thermal heat from the gaseous refrigerant 34 to the environment. As the gaseous refrigerant 34 cools, the refrigerant 34 condenses into a liquid state.

The liquid refrigerant 34 exits the condenser 70 and passes through the coolant loop 30. The insulated temperature sensor 74 measures the coolant loop temperature, and thus the liquid refrigerant temperature, and provides an electrical signal 82 to the controller 76 indicative of the temperature of the liquid refrigerant 34 leaving the condenser 70.

Referring now to FIG. 3, the controller circuitry 80 compares the electrical signal 82 from the temperature sensor 74 to a predetermined temperature selected by the user to vary the speed of the variable speed fan 78. An operational amplifier 84 amplifies the electrical signal 82 from the temperature sensor and passes the amplified signal to the input of a pulse width modulator 86. In presently preferred embodiments, the operational amplifier 84 produces a proportional signal between about 0 and 5 volts. The pulse width modulator 86 receives the output from the operational amplifier 84 and produces a square wave having a duty cycle which is directly proportional to the magnitude of the input.

The output of the pulse width modulator 86 passes to the gate of a field effect transistor 88 which is rendered conductive when the duty cycle is "on." By adjusting the speed of the fan 78, the controller 76 regulates the amount of ambient air that the fan forces over the cooling coils 72, thus controlling the temperature and pressure of the liquid refrigerant 34 leaving the condenser 70.

Referring again to FIG. 2, the liquid refrigerant 34 passes through the coolant loop 30 and into the capillary tube 38. The relatively long length and reduced inner diameter of the capillary tube 38 restrict the flow of the liquid refrigerant 34, producing a desired higher pressure at the inlet of the capillary tube 38 through which the refrigerant passes to the evaporator 40 where the refrigeration cycle repeats.

It can thus be seen that the preceding description provides one or more preferred embodiments of the present invention. It should be understood that any and all equivalent realizations of the present invention are included within the scope and spirit thereof. The embodiments depicted are presented by way of example only and are not intended as limitations upon the present invention. Thus, it should be understood by those of ordinary skill in this art that the present invention is not limited to these embodiments since modifications can be made. Therefore, it is contemplated that any and all such embodiments are included in the present invention as may fall within the literal and equivalent scope of the appended claims.

What is claimed is:

1. An apparatus operative to maintain an integrated circuit device at an operational temperature of approximately −40 degrees Centigrade or below to achieve selected electronic performance characteristics, said apparatus comprising:
   a coolant loop containing a refrigerant;
   an evaporator in said coolant loop adapted to be in thermal contact with said integrated circuit device so as to cool said integrated circuit device, said evaporator defining a flow channel for passage of said refrigerant to remove thermal energy at said integrated circuit device;
   a compressor in said coolant loop for increasing the pressure of said refrigerant exiting said evaporator;
   a condenser in said coolant loop between said compressor and said evaporator, wherein said condenser has a variable speed fan operable to force air across said condenser to transfer thermal energy from said condenser to the environment;
   a temperature sensor in thermal contact with said refrigerant; and
   a controller in operative communication with said temperature sensor to control said variable speed fan to maintain said refrigerant at a predetermined temperature, wherein said controller functions to proportionately control said fan over a continuously variable range of speeds so as to maintain said integrated circuit device at said operational temperature of −40 degrees Centigrade or below.

2. The apparatus as set forth in claim 1, wherein said temperature sensor is in thermal contact with said refrigerant between said condenser and said evaporator.

3. The apparatus as set forth in claim 2, wherein said temperature sensor comprises a thermocouple.

4. The apparatus as set forth in claim 3, wherein said thermocouple is in thermal contact with said coolant loop without penetrating same.

5. The apparatus as set forth in claim 4, wherein said thermocouple is thermally isolated from an ambient environment by insulation.

6. The apparatus as set forth in claim 1, wherein said coolant loop includes a capillary tube connected to said evaporator for restricting flow of said refrigerant from said condenser to said evaporator.

7. The apparatus as set forth in claim 6, wherein said compressor produces a pressure of said refrigerant entering said capillary tube of more than 225 pounds per square inch.

8. The apparatus as set forth in claim 1, wherein said variable speed fan is a variable speed DC fan.

9. The apparatus as set forth in claim 8, wherein said controller functions to apply a pulse width modulated signal to said variable speed DC fan, a speed of said fan being proportional to a duty cycle of said pulse width modulated signal.

10. A refrigerant system for cooling an integrated circuit device to a predetermined operational temperature to achieve selected electronic performance characteristics, said refrigerant system comprising:

a coolant loop containing refrigerant;

an evaporator in thermal contact with said integrated circuit device, said evaporator having an inlet plenum, an exhaust plenum, and defining a flow channel between said inlet plenum and said exhaust plenum, wherein said refrigerant passes through said flow channel to absorb thermal energy from said integrated circuit device thereby changing said refrigerant to a gaseous state;

a compressor having a suction and a discharge, wherein said coolant loop fluidly connects said evaporator exhaust plenum to said compressor suction, wherein said gaseous refrigerant passes through said compressor and is discharged at a higher pressure;

a condenser fluidly connected in said coolant loop between said compressor discharge and said evaporator inlet plenum, said condenser including a variable speed fan operational across said condenser to remove thermal energy from said gaseous refrigerant passing through said condenser thereby changing said gaseous refrigerant to a liquid state;

a temperature sensor in the form of a thermocouple in thermal contact with said refrigerant between said condenser and said evaporator; and a controller operative to receive a temperature signal from said temperature sensor indicative of a temperature of said refrigerant, said controller producing a pulse width modulated output to proportionately control said variable speed fan over a continuously variable range of speeds to maintain said refrigerant at a predetermined temperature and thus maintain said integrated circuit device at said predetermined operational temperature.

11. The apparatus as set forth in claim 10, wherein said coolant loop includes a capillary tube connected to said evaporator inlet plenum for restricting flow of said refrigerant from said condenser to said evaporator inlet plenum.

12. The apparatus as set forth in claim 11, wherein said compressor produces a pressure of said refrigerant entering said capillary tube of more than 225 pounds per square inch.

13. The apparatus as set forth in claim 10, wherein said thermocouple is in thermal contact with said coolant loop without penetrating same.

14. The apparatus as set forth in claim 13, wherein said thermocouple is thermally isolated from an ambient environment by insulation.

* * * * *